(12) United States Patent
Martin

(10) Patent No.: US 6,324,003 B1
(45) Date of Patent: Nov. 27, 2001

(54) CALCIUM FLUORIDE ($CaF_2$) STRESS PLATE AND METHOD OF MAKING THE SAME

(75) Inventor: Gene Jay Martin, New Haven, CT (US)

(73) Assignee: Silicon Valley Group, Inc., Ridgefield, CT (US)

( * ) Notice: Subject to any disclaimer, the term of this patent is extended or adjusted under 35 U.S.C. 154(b) by 0 days.

(21) Appl. No.: 09/471,484

(22) Filed: Dec. 23, 1999

(51) Int. Cl.$^7$ .................................................. G02B 5/30
(52) U.S. Cl. ..................... 359/494; 359/495; 359/500; 359/352
(58) Field of Search .................................. 359/494, 495, 359/500, 352

(56) References Cited

U.S. PATENT DOCUMENTS 3,600,611  8/1971  Treharne ........................... 310/8.2

FOREIGN PATENT DOCUMENTS

| 0 942 297 A2 | 9/1999 | (EP) | G02B/1/02 |
|---|---|---|---|
| 0 834 753 A1 | 4/1998 | (EP) | G02B/5/30 |
| 0 942 300 A2 | 9/1999 | (EP) | G02B/5/30 |
| 1098897 | 7/1966 | (GB) | G02B/5/30 |

OTHER PUBLICATIONS

Cheng J.C. et al., "Photoelastic modulator for the 0.55–13–$\mu$m range," Applied Optics, vol. 15, No. 8, Aug. 1976, pp. 1960–1965.
McClay J.A. et al., "157nm optical lithography: The accomplishments and the challenges," Solid State Technology, Cowan Publishing Corp., vol. 42, No. 6, Jun. 1999, pp. 57, 59–60, 62, 64, 66, 68.
Copy of International Search Report, Application No. PCT/US00/34645, issued Jun. 22, 2001, 10 pages.
Max Born et al., *Principles of Optics*, Electromagnetic Theory of Propagation, Interference and Diffraction of Light, Stress Birefringence and Form Birefringence, See 14.5, Pergamon Press Inc., 1980, pp. 703–708.

*Primary Examiner*—Cassandra Spyrou
*Assistant Examiner*—Craig Curtis
(74) *Attorney, Agent, or Firm*—Sterne, Kessler, Goldstein & Fox, P.L.L.C.

(57) ABSTRACT

A calcium fluoride ($CaF_2$) stress plate provides a predetermined amount of optical delay. The $CaF_2$ stress plate has surfaces that lie in $CaF_2$ cubic planes, and delays an optical wavefront that is incident to a set of cubic planes along a transmission axis. To implement the desired delay, the $CaF_2$ stress plate has a first index of refraction that is seen by a first field component of the optical wavefront, and a second index of refraction that is seen by a second field component of the optical wavefront. The optical delay of the stress plate is proportional to the differences between the two indexes of refraction. Embodiments of the invention include a method of fabricating the $CaF_2$ stress plate from a sample of $CaF_2$ material. The method includes the step of determining the orientation of the cubic planes for the $CaF_2$ sample, as the sample is typically oriented along the cleave planes. Next, the sample is processed to generate a $CaF_2$ plate whose surfaces are oriented in $CaF_2$ cubic planes. Next, a compressive or tensile force is applied perpendicular to at least one pair of cubic plane surfaces and perpendicular to the transmission axis for the incident optical wavefront. The compressive/tensile force has the effect of changing the index of refraction for electromagnetic fields that are oriented along the direction of the force vector from the characteristic index of refraction for $CaF_2$. After which, the $CaF_2$ stress plate effectively has two indexes of refraction, where the amount optical delay is proportional to the difference between the indexes of refraction. Next, the amount of optical delay is measured to determine if the measured delay is sufficiently close to the specified delay. If it is not, then more compression or stress can be applied until the desired delay is achieved. In alternate embodiment, shear forces are applied to the $CaF_2$ plate instead of compressive or tensile forces. The shear forces are applied along mechanical surfaces that are rotated 45 degrees to the CaF cubic planes of the plate. As with the compressive/tensile forces, the shear forces operate to change the index of refraction of the $CaF_2$ plate in the direction of a resultant force vector.

15 Claims, 11 Drawing Sheets

FACE CENTERED CUBIC STRUCTURE

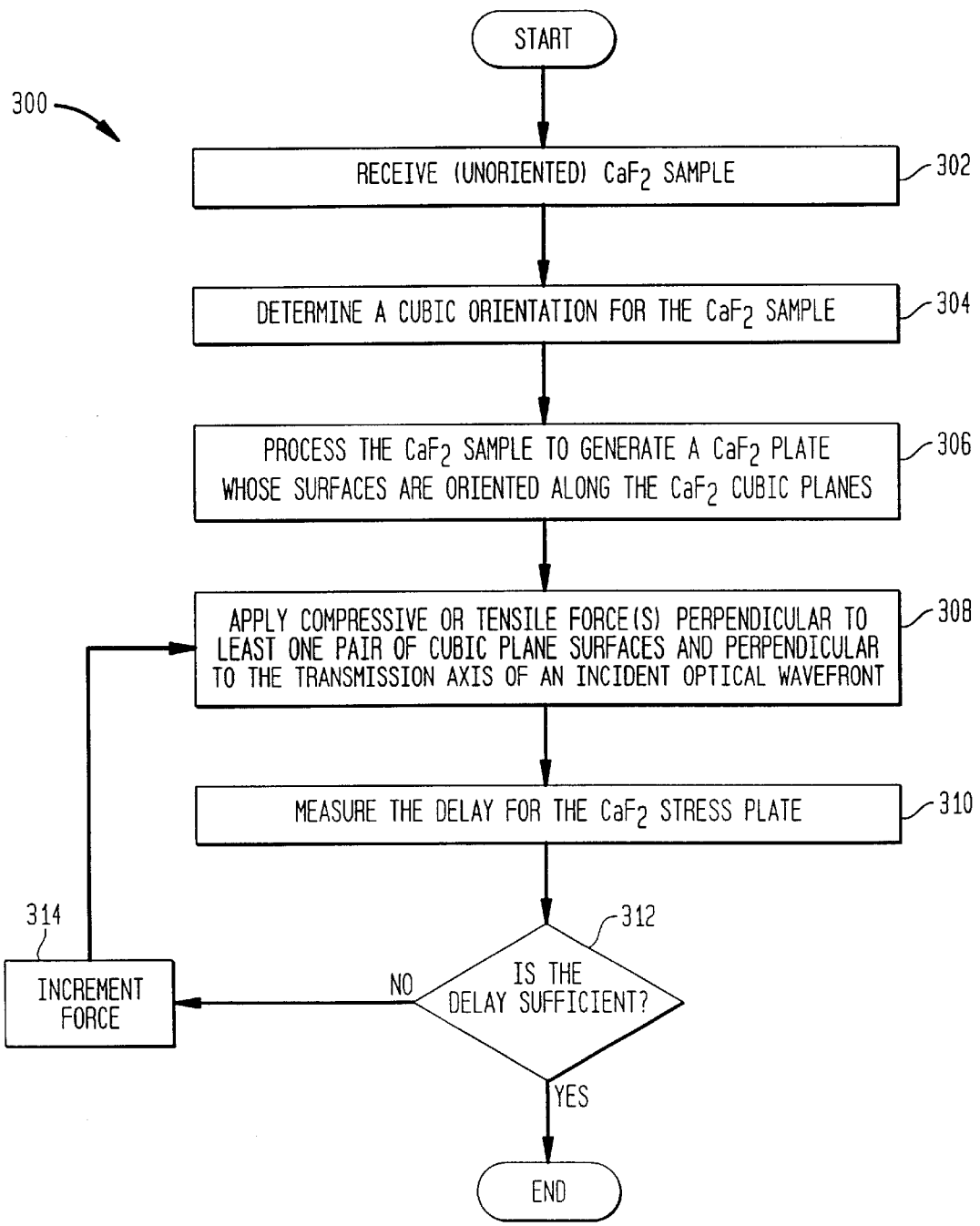

even smaller wavelengths (e.g. 157 nm)

CALCIUM FLUORIDE (CAF₂) STRESS PLATE AND METHOD OF MAKING THE SAME

BACKGROUND OF THE INVENTION

1. Field of the Invention

The present invention is generally related to optical stress plates that are used for delaying optical wavefronts, and methods for making the same.

2. Related Art

Many semiconductor fabrication systems utilizes photolithography techniques in the fabrication of semiconductor wafers. During fabrication, one or more layers of circuit patterns are built up on a semiconductor wafer. This is accomplished by illuminating a reticle with light, where the reticle contains a desired circuit pattern. The resulting reticle image is then projected onto photosensitive resist that covers the semiconductor wafer. After a series of exposures and subsequent processing, a semiconductor wafer containing the desired circuit pattern is manufactured.

It is well known that the smallest feature that can be fabricated on the semiconductor wafer is limited to the optical wavelength of the light used in the illumination system. It is also well known that the upper limit on circuit clock speeds varies inversely with the size of the semiconductor features. Therefore, the demand for higher clock speeds necessitates that semiconductors have smaller circuit features. Circuit features of 0.25 $\mu$m (micrometers) have been achieved with photolithography systems using light wavelengths of 193 m (nanometers). To achieve geometries below 0.25 $\mu$m, even smaller wavelengths (e.g. 157 nm) must be used.

The illumination system used in photolithography includes various optical components that manipulate light to project a reticle image on the semiconductor wafer. One common component in the illumination system is an optical delay plate (also called a stress plate). Stress plates can be used to delay or retard a light wavefront by a specified amount. Stress plates can also be used to convert the polarization of light from one polarization to another. For example, a ¼ (quarter) wave stress plate that is rotated 45 degrees to the incident light converts linearly polarized light to circularly polarized light and visa-versa. In another example, horizontally polarized light is converted to vertically polarized light by using a ¼ wave stress plate and a mirror. This is done by transmitting the horizontally polarized light through the ¼ wave stress plate to generate circularly polarized (CP) light. The CP light is then reflected off the mirror to reverse the CP polarization. Finally, the reflected CP light is sent back though the ¼ wave stress plate to generate vertically polarized light.

In order for a stress plate to function as desired, it must be fabricated from a material that will transmit sufficient light at the wavelength of interest. Conventional stress plates are made of fused silica or man-made quartz. These conventional materials do not sufficiently transmit light at wavelengths that are below 193 nm. As stated above, the smallest feature that can be fabricated on the semiconductor wafer is limited to the optical wavelength of the light used in the system. As such, photolithography systems that utilize conventional stress plates can manufacture features that are no smaller than approximately 0.25 $\mu$m. Therefore, what is needed is a stress plate that is functional at optical wavelengths that are below 193 nm (including 157 nm) to support the fabrication of semiconductor wafers having circuit features that are smaller than 0.25 $\mu$m.

SUMMARY OF THE INVENTION

The present invention is directed at a Calcium Fluoride (CaF₂) optical stress plate and a method for making the same. The CaF₂ stress plate has surfaces that lie in CaF₂ cubic planes, and delays an optical wavefront that is incident to a set of cubic planes along a transmission axis. To implement the desired delay, the CaF₂ stress plate has a first index of refraction that is seen by a first field component of the optical wavefront, and a second index of refraction that is seen by a second field component of the optical wavefront. The optical delay of the stress plate is proportional to the differences between the two indexes of refraction. In one embodiment, the first index of refraction is the characteristic index of refraction for CaF₂ material, and the second index of refraction is higher or lower than the characteristic index of refraction. In an alternate embodiment, the first index of refraction is higher than the characteristic index of refraction and the second index of refraction is lower than the characteristic index of refraction.

An advantage of fabricating an optical delay from CaF₂ is that CaF₂ is able to transmit light having wavelengths that are below 193 nm (including wavelengths at 157 nm) with relatively little attenuation when compared to traditional optical materials such as fused silica or man-made quartz. Therefore, CaF₂ stress plates enable semiconductor fabrication systems to produce circuit features of 0.25 $\mu$m and smaller using light wavelengths of 157 nm and below.

The present invention also includes a method of fabricating a CaF₂ stress plate that has a specified optical delay from a sample of CaF₂. The method includes the step of determining the orientation of the cubic planes for the CaF₂ sample, as the sample is typically oriented along the cleave planes. Next, the sample is processed to generate a CaF₂ plate whose surfaces are oriented in CaF₂ cubic planes. This can be done by cutting a CaF₂ plate from the CaF₂ sample along the identified cubic planes and then polishing the sample to a commercial finish. Next, a compressive or tensile force is applied perpendicular to at least one pair of the cubic plane surfaces, and perpendicular to the transmission axis for the incident optical wavefront. The compressive or tensile force has the effect of modifying the characteristic index of refraction for electromagnetic fields that are oriented along the direction of the force vector. After which, the CaF₂ stress plate effectively has two indexes of refraction, where the amount optical delay is proportional to the difference between the indexes of refraction. Next, the amount of optical delay is measured to determine if the measured delay is sufficiently close to the specified delay. If it is not, then more compression or stress can be applied until the desired delay is achieved. In embodiments of the invention, an applied force of 300 psi (pounds per square inch) to 500 psi causes an optical delay of 90 degrees for the incident optical wavefront.

In an alternate embodiment, shear forces are applied to the CaF₂ plate instead of compressive or tensile forces. The shear forces are applied along mechanical surfaces that are rotated 45 degrees to the cubic planes of the CaF₂ plate. As with the compressive or tensile forces, the shear forces operate to change the index of refraction of the CaF₂ plate in the direction of a resultant force vector.

Further features and advantages of the invention, as well as the structure and operation of various embodiments of the invention, are described in detail below with reference to the accompanying drawings. The drawing in which an element first appears is typically indicated by the leftmost character (s) and/or digit(s) in the corresponding reference number.

BRIEF DESCRIPTION OF THE FIGURES

The present invention will be described with reference to the accompanying drawings, wherein:

FIG. 3 illustrates a flowchart 300 for making a $CaF_2$ stress plate using compression and/or tensile forces according to embodiments of the present invention;

DETAILED DESCRIPTION OF THE PREFERRED EMBODIMENTS

1. Example Environment

Before describing the invention in detail, it is useful to describe an example environment for the invention. Description of this example environment is provided for convenience only, and is not intended to limit the invention in any way. In fact, after reading the invention description, it will become apparent to a person skilled in the relevant arts how to implement the invention in alternate environments than that described herein.

Figure 1:
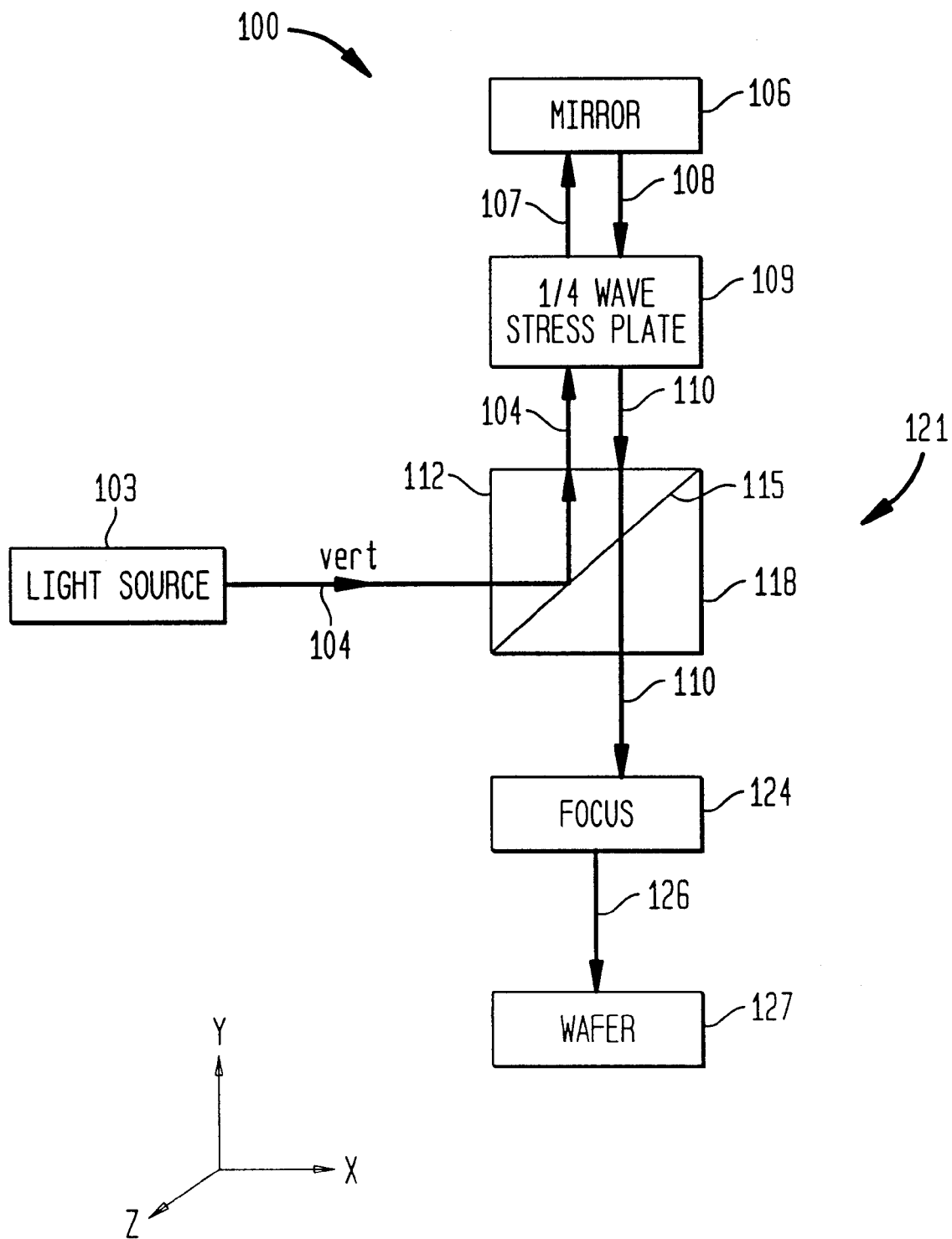
FIG. 1 illustrates a diagram of an illumination system that is an example embodiment for the present invention.

FIG. 1 illustrates an example environment including illumination system 100 for focusing light on a wafer 127. Illumination system 100 can be part of a photolithography system for manufacturing a desired circuit pattern on the wafer 127. Illumination system 100 includes: a light source 103; a mirror 106; a stress plate 109; a beam splitter cube 121 having sections 112 and 118 and coating(s) 115; and a focus module 124.

Illumination system 100 operates as follows. Light source 103 provides a light wavefront 104 having a specific wavelength and polarization that is incident on the beam splitter cube 121. For purposes of discussion, the light wavefront 104 is vertically polarized, although other polarizations could be used.

The light wavefront 104 passes through section 112 of the cube 121 and is incident on the coating 115. The coating 115 has optical transmission properties that vary depending on the polarization of the incident light. When the incident light is vertically polarized, the coating 115 is reflective. When incident light is horizontally polarized, then the coating 115 is transmissive. Since wavefront 104 is vertically polarized, it is reflected upward by the coating 115 to the stress plate 109.

Stress plate 109 is approximately a ¼ wave stress plate at the wavelength of interest and is rotated by 45 degrees in the zx plane relative to the incident wavefront. The result is that the stress plate 109 converts the vertically polarized light to circularly polarized (CP) light 107, which is incident on the mirror 106.

The mirror 106 reflects the CP light 107 and reverses the circular polarization to generate reversed CP light 108. The CP light 108 propagates back through the stress plate 109 and is converted to horizontally polarized light 110 that is incident on the cube 121. Therefore, by passing linearly polarized light though a ¼ wave stress plate twice using a mirror, the linear polarization is maintained but the polarization is rotated by 90 degrees.

The cube 121 passes the horizontally polarized light 110 to the focus module 124 without substantial change. This occurs because the coating 115 is transmissive to horizontally polarized light as discussed above.

The focus module 124 contains the reticle having the desired circuit pattern. The focus module 124 causes the incident light to pass through the reticle generating a reticle image 126 that is focused on the wafer 127.

2. Calcium Fluoride ($CaF_2$) Stress Plate

Figure 2A:
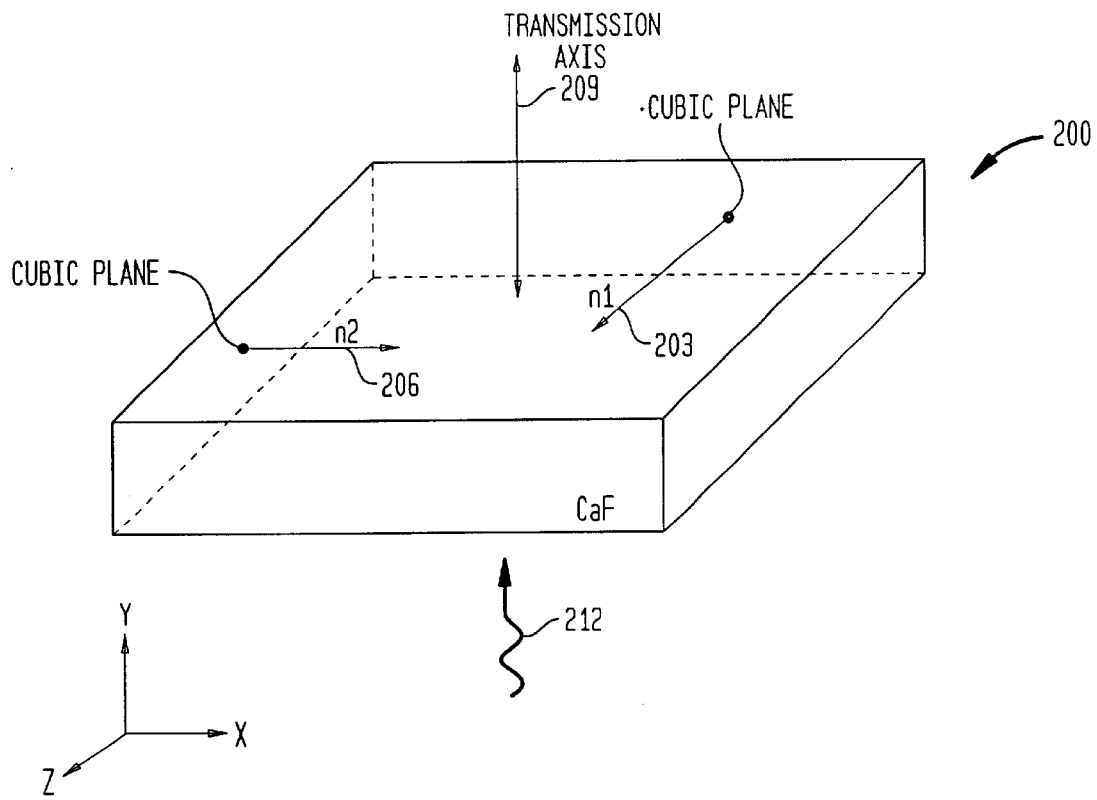
FIG. 2A illustrates a $CaF_2$ stress plate according to embodiments of the present invention.
Figure 2B:
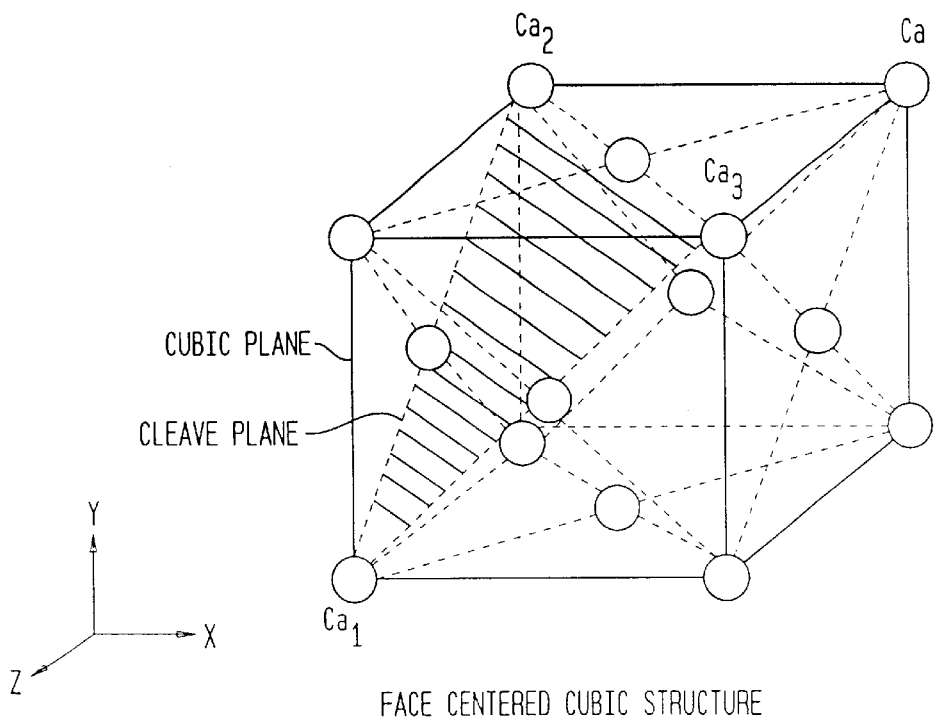
FIG. 2B illustrates a face centered cubic crystal structure for $CaF_2$.

FIG. 2A illustrates stress plate 200 for delaying an optical wavefront according to embodiments of the present invention. Stress plate 200 is made of calcium fluoride material having the chemical symbol $CaF_2$. $CaF_2$ has a well known crystalline structure that is face centered cubic. FIG. 2B illustrates the face centered cubic structure for $CaF_2$, and includes 8 calcium (Ca) ions that define a cube having an additional Ca ion in the center of each of the six surfaces of the cube. (The fluorine ions are not shown for ease of illustration.) The outer surfaces of the cube are the cubic planes, and the cleave planes are defined by the dotted lines. A portion of a cleave plane is defined by Ca ions $Ca_1$, $Ca_2$, and $Ca_3$, is cross-hatched. The easiest plane to cut or break a crystal material is along the cleave planes, and not the cubic planes.

An advantage of making an optical delay out of $CaF_2$ is that $CaF_2$ is able to transmit electromagnetic waves having wavelengths that are below 193 nm (including wavelengths at 157 nm) with relatively little attenuation when compared to traditional optical materials such as fused silica or man-made quartz. Therefore, $CaF_2$ stress plates enable manufacturing processes to fabricate semiconductors with circuit geometries that are smaller than 0.25 $\mu$m.

The stress plate 200 has two different indexes of refraction that are seen by electromagnetic (EM) fields depending on the EM field orientation. The first index of refraction is $n_1$, and is seen by EM fields that are oriented with vector 203. The second index of refraction is $n_2$ and is seen by an EM fields that are oriented with vector 206. As will be understood, the index of refraction for a material defines the phase velocity for an electromagnetic wave traveling through the material relative to the phase velocity in free space.

In embodiments of the invention, $n_1$, is the characteristic index of refraction for undisturbed $CaF_2$, and $n_2$ is a higher or lower index of refraction caused by a compression or tensile force that is aligned with the vector 206. The modification of the characteristic index of refraction for $CaF_2$ using compression and/or tensile forces is discussed further in the following section. Alternatively, both $n_1$ and $n_2$ are different from the index of refraction for undisturbed $CaF_2$, where one ($n_1$ or $n_2$) has a higher index of refraction than undisturbed $CaF_2$, and the other one has a lower index of refraction than undisturbed $CaF_2$. (Hereinafter, vector 203 is referred to as the index of refraction vector 203 and is assumed to include its associated index of refraction $n_1$. Similarly, vector 206 is referred to as the index of refraction vector 206 and is assumed to include the associated index of refraction $n_2$.)

As shown in FIG. 2A, both index of refraction vectors 203 and 206 are perpendicular to an associated set of $CaF_2$ cubic planes, and therefore are perpendicular to each other. The vectors 203 and 206 are also perpendicular to a transmission axis 209 that is associated with the stress plate 200. The transmission axis 209 defines the direction that an optical wavefront is required to travel through the stress plate 200 in order to achieve the desired delay. For stress plate 200, the first index of refraction vector 203 is aligned along the z-axis, and the second index refraction vector 206 is aligned in the x-axis, as defined by the coordinate system for FIG. 2A. The transmission axis 209 is along the y-axis through the plate 200. The desired optical delay can be achieved by transmitting the optical wavefront 212 through either side of the stress plate 200 along the y-axis.

When an optical wavefront 212 passes through the stress plate along the transmission axis 209, the optical wavefront is retarded or delayed by an amount that is proportional to the differences between the index of refraction vectors. The delay occurs because the optical wavefront 212 has an EM field component that is oriented with the first index of refraction vector 203, and an EM field component that is oriented with the second index of refraction vector 206. As a result, the field component oriented with the vector 203 will have a different phase velocity than that of the field component oriented with the vector 206 while passing through the stress plate 200, and thereby implementing the delay.

3. Method of Fabricating a $CaF_2$ Stress Plate

As described above, a $CaF_2$ stress plate operates to delay an optical wavefront by having two different indexes of refraction that are seen by different field components of the optical wavefront. The present section describes methods of fabricating a $CaF_2$ stress plate using compressive, tensile, and shear forces that are applied to cubic plane surfaces of the $CaF_2$ plate.

A. Compression and/or Tensile Forces

FIG. 3 depicts operational flowchart 300 that describes a method of producing a $CaF_2$ stress plate from a sample of $CaF_2$ material according to embodiments of the invention. Flowchcart 300 is described as follows.

Figure 4:
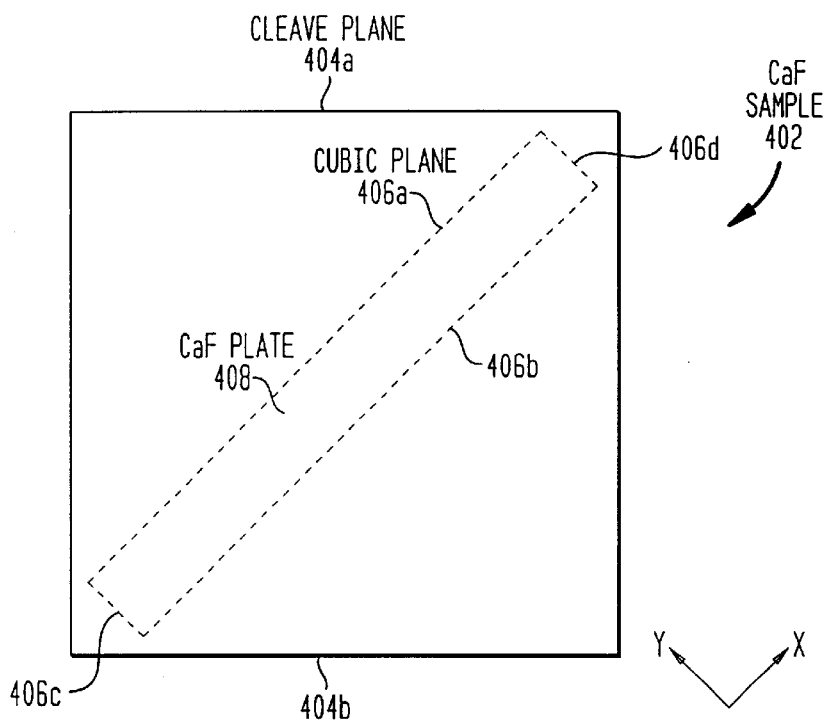
FIG. 4 illustrates a sample of unprocessed $CaF_2$ that is oriented along cleave planes containing a $CaF_2$ plate that is oriented along cubic planes according to embodiments of the present invention.

In a step 302, a sample of $CaF_2$ material is received. FIG. 4 illustrates a $CaF_2$ sample 402 having cleave planes 404 and cubic planes 406. Unprocessed samples are typically oriented in a cleave plane because the cleave plane is the most convenient plane to cut the sample from a newly grown $CaF_2$ ingot.

In a step 304, the orientation of the cubic planes for the $CaF_2$ sample are determined. Determining the cubic plane orientation for a sample can be done using known x-ray techniques or other standard techniques. The cubic plane orientation is determined so that a $CaF_2$ plate having surfaces oriented along the cubic planes can be cut from the $CaF_2$ sample, as illustrated by $CaF_2$ plate 408 that is defined by cubic planes 406 in FIG. 4.

Figure 5:
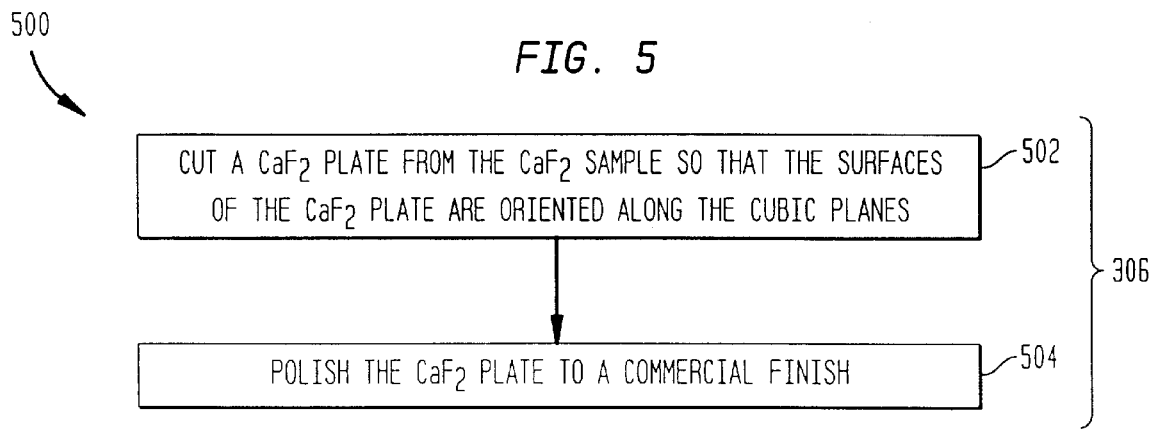
FIG. 5 illustrates a flowchart 500 for processing a sample of $CaF_2$ to produce a $CaF_2$ plate that is oriented along cubic planes according to embodiments of the present invention.
Figure 6A:
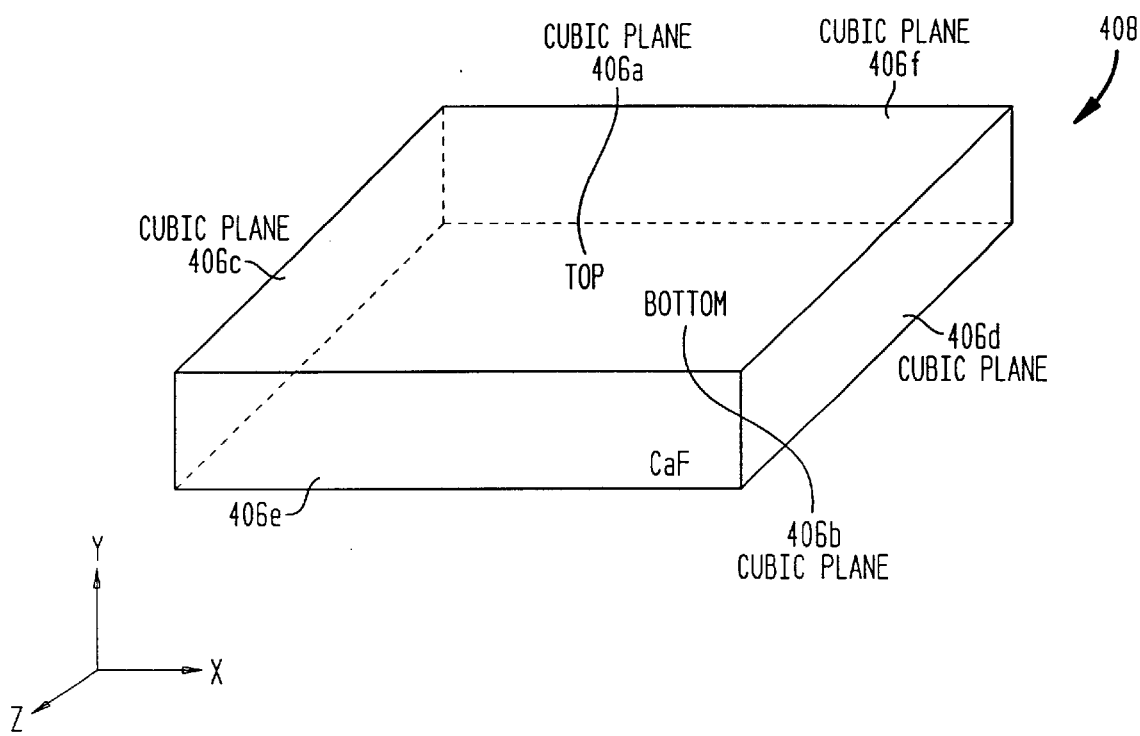
FIG. 6A illustrates a $CaF_2$ plate that is oriented along the cubic planes according to embodiments of the present invention.

In a step 306, the $CaF_2$ sample is processed to generate a $CaF_2$ plate having all 6 surfaces that lie in $CaF_2$ cubic planes. Step 306 is further described by flowchart 500 that is shown in FIG. 5 and is described as follows. In a step 502, a $CaF_2$ plate that is oriented in the $CaF_2$ cubic planes is cut from the $CaF_2$ sample, as illustrated by $CaF_2$ plate 408 that is shown in FIG. 4. Various techniques for cutting or grinding crystal materials are known by those skilled in the arts. In a step 504, the $CaF_2$ plate is polished to a commercial finish, so that the surfaces are sufficiently flat and parallel for optical transmission. FIG. 6A depicts the $CaF_2$ plate 408 after being cut from the sample 402, where all 6 surfaces 406a–f of the plate lie in a $CaF_2$ cubic plane.

In a step 308, a compression force or tensile force is applied perpendicular to at least one set of cubic plane surfaces and perpendicular to the transmission axis for an incident optical wavefront. The compression or tensile force stresses the plate in the direction of the force, which changes the index of refraction for electromagnetic fields that are oriented along the direction of the stress. In other words, the stressed $CaF_2$ plate effectively has two indices of refraction. One index of refraction is seen by electromagnetic fields that are oriented in the direction of the stress. The other index of refraction is seen by electromagnetic fields that are oriented in non-stress directions. It is the different refraction indexes according to field orientation that cause the desired delay for the optical wavefront traveling along the transmission axis. The remaining steps in flowchart 300 are described further below.

Figure 6B:
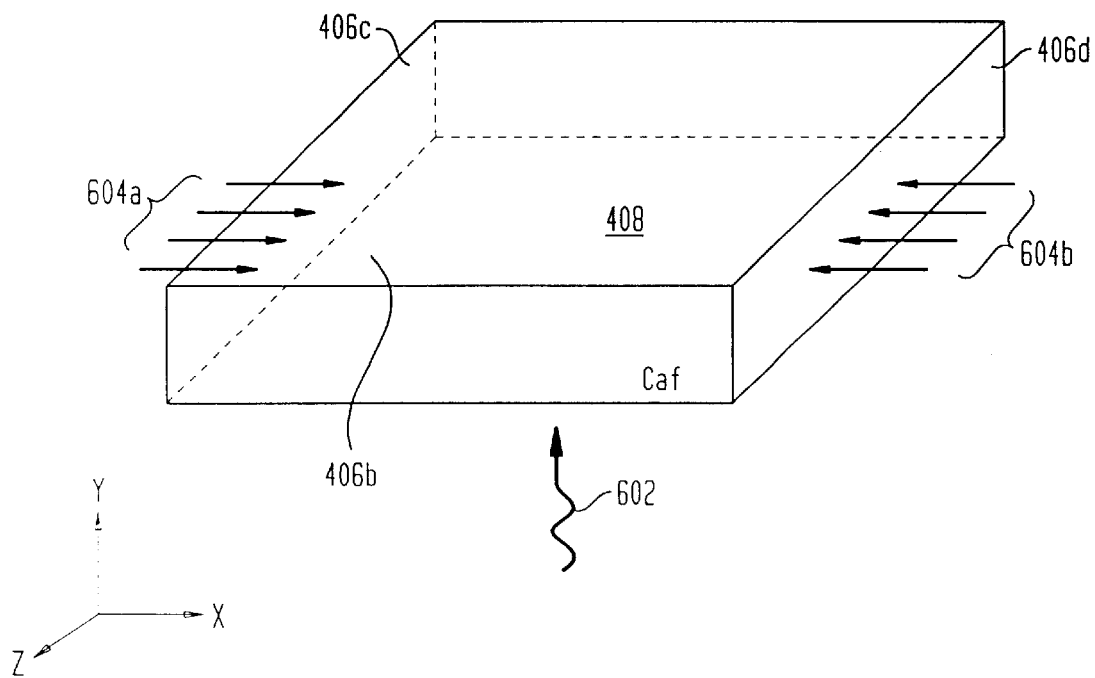
FIGS. 6B–6G illustrate various combinations of applying compression and/or tensile forces perpendicular to $CaF_2$ cubic planes to implement a desired optical delay according to embodiments of the present invention.
Figure 6C:
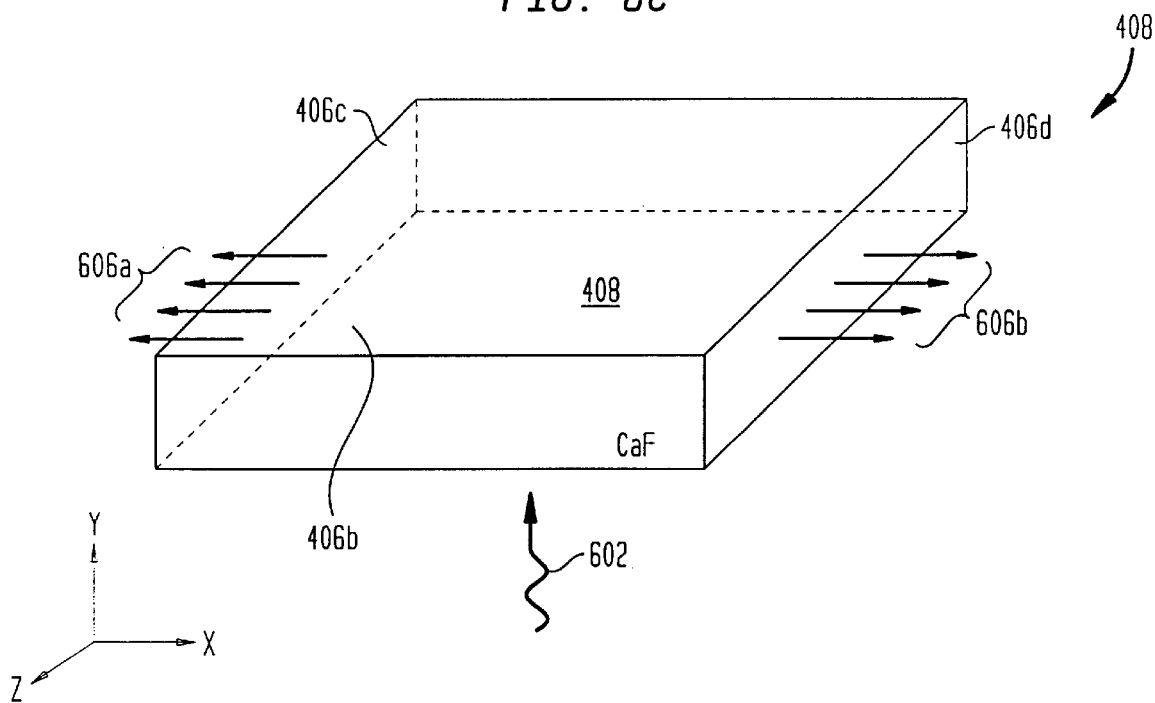
Figure 6D:
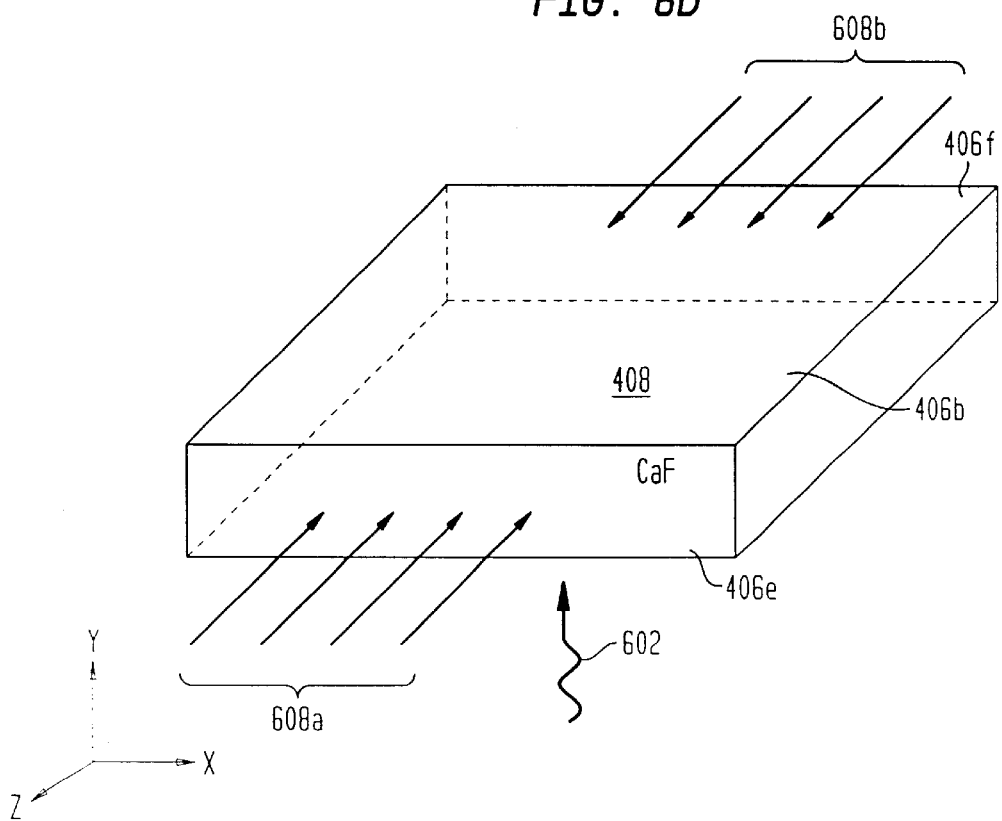

FIGS. 6B–6G illustrate the various embodiments for the application of compression and/or tensile forces in the step 308 to the $CaF_2$ plate 408. These figures include an optical wavefront 602 that is incident on the surface 406b along the y-axis to define the transmission axis relative to the applied force vectors. (Surface 406b is illustrated as the bottom surface for simplicity.) For optimum delay results, the optical wavefront 602 should be incident perpendicular to the surface 406b (and therefore perpendicular to the force vectors). The same delay is achieved if the optical wavefront is incident on the top surface 406a. If the optical wavefront 602 is a traverse electromagnetic (TEM) wave, the wavefront 602 will have an EM field component in the x-direction and an EM field component in the z-direction, as will be understood by those skilled in the arts. FIGS. 6B–6D are now discussed in more detail.

In FIG. 6B, the compression force 604a and 604b is applied along the x-direction and perpendicular to surfaces 406c and 406d of the $CaF_2$ plate 408. In a preferred embodiment of the present invention, compression force can be applied using one or more screws that are abutted to the surfaces 406c,d. For the best results, the compressive force should be applied uniformly along the surfaces 406c and 406d using multiple screws. The compression force will cause an internal stress that changes the index of refraction for the $CaF_2$ plate that is seen by EM fields that are oriented in the x-direction. The index of refraction for EM fields that are oriented in the z-direction remains unchanged. Therefore, the optical wavefront 602 will be delayed by traveling through the plate 408 because the EM fields that are oriented in x-direction are delayed compared to those EM fields that are oriented in the z direction. Experimental results show that 90 degrees of delay can be achieved at the 157 nm wavelength by applying 300–500 psi of force.

In FIG. 6C, a tensile force (or pulling force) 606a,b is applied perpendicular to surfaces 406c and 406d. In a preferred embodiment, tensile force can be applied by epoxying a bar to each surface 406c and 406d and pulling outward on the bars. As described above, the applied force changes the index of refraction for EM fields that are oriented in the force direction, thereby causing the desired delay.

In FIG. 6D, a compression force 608a,b is applied to surfaces 406e and 406f The applied force 608 changes the index of refraction for EM fields that are oriented in the z direction but not the x-direction, thereby causing the desired delay.

Figure 6E:
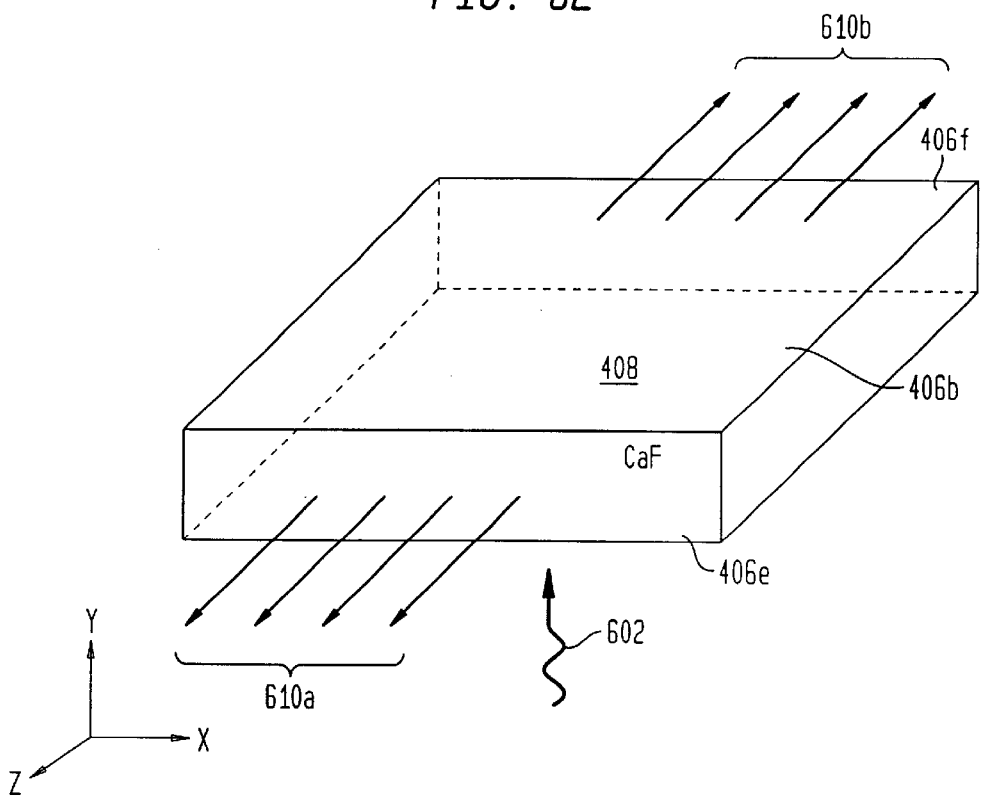

In FIG. 6E, a tensile force (or pulling force) 610a,b is applied perpendicular to the surfaces 406e and 406f to implement the desired delay.

Figure 6F:
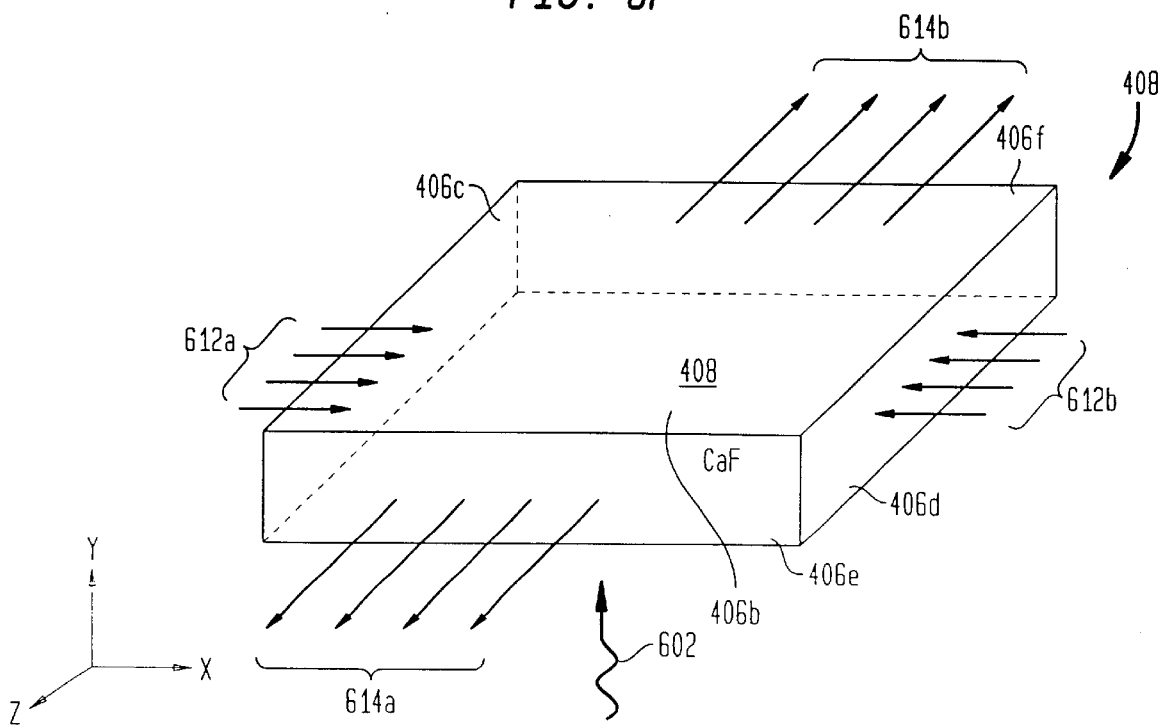

In FIG. 6F, a compression force 612a,b is applied perpendicular to surfaces 406c and 406d, and a tensile force 614a,b is applied perpendicular to surfaces 406e and 406f. In this embodiment, the index of refraction for EM fields oriented in the x direction is changed, as well as the index of refraction for EM fields that are oriented in the z direction. However, one index of refraction is increased and the other is decreased because one force is a compression force and the other force is a tensile force.

Figure 6G:
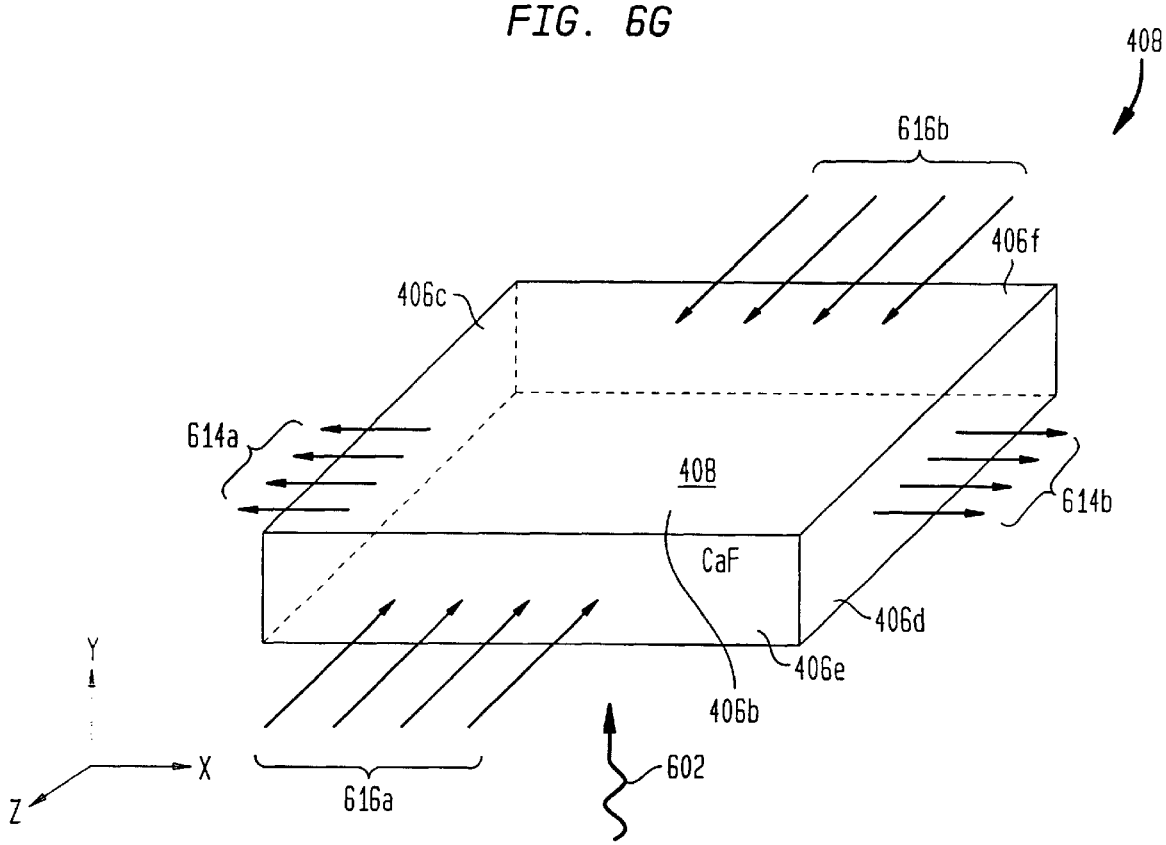

In FIG. 6G, a tensile force 614a,b is applied perpendicular to surfaces 406c and 406d and a compression force 616a,b is applied perpendicular to surfaces 406e and 406f Similar to that described in FIG. 6F, the indexes of refraction for EM waves oriented in both the x-direction and z-direction are changed but the variations have opposite signs.

It is noted in FIGS. 6B–6G that the compression and/or tensile forces are applied to cubic planes that are not the set of planes that receive the incident optical waveform (planes 406a and 406b). Instead the compression or tensile forces are applied to one or more of the other two sets of cubic planes. Those other sets of cubic planes being 406c, 406d and 406e, 406f.

Returning now to flowchart 300, in a step 310, the optical delay is measured at the wavelength of interest to determined if it is the desired amount of delay. There are various apparatus, including polarimeters, for measuring optical delay that are known by those skilled in the relevant arts.

Figure 7:
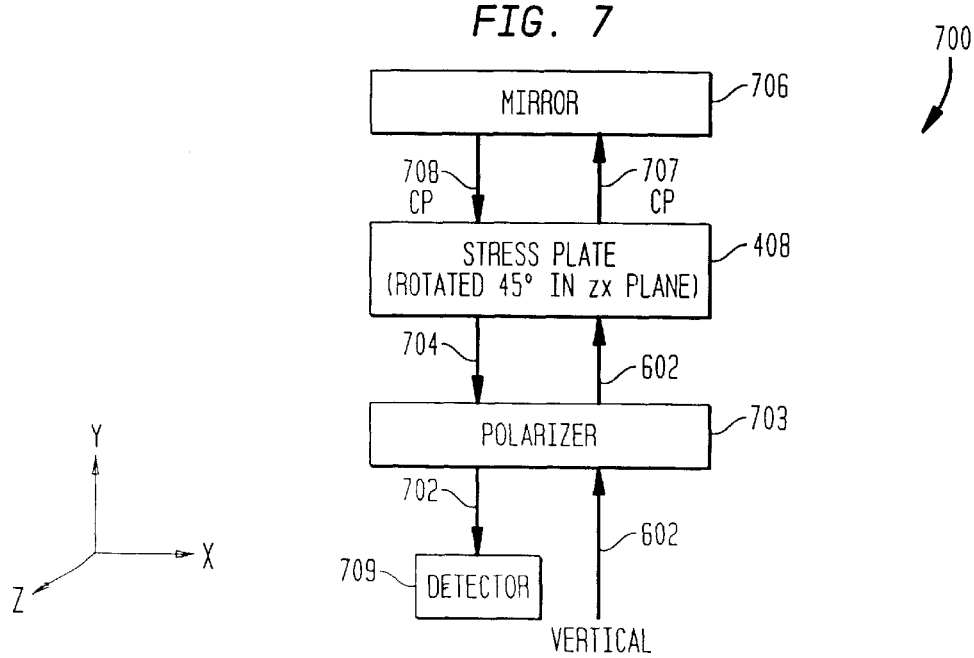
FIG. 7 illustrates a measurement system 700 for measuring a 90 degree stress plate according to embodiments of the present invention.

FIG. 7 illustrates measurement system 700 for determining if the optical delay of the stress plate 408 has reached a desired 90 degrees for the incident optical wavefront 602. For purposes of discussion, the optical wavefront 602 is vertically polarized. FIG. 7 includes a vertical polarizer 703, the stress plate 408, a mirror 706, and a detector 709, and operates as follows.

The polarizer 703 is matched to the vertical polarized wavefront 602, and therefore substantially passes the wavefront 602 to the stress plate 408. The stress plate 408 is rotated by 45 degrees in zx plane, and thereby converts the wavefront 602 to a circular polarized wavefront 707. The mirror 706 reflects the CP wavefront 707 and reverses the CP polarization to generate CP wavefront 708. The CP wavefront 708 passes back through the stress plate 408 and is converted to substantially horizontally polarized light 704 if the stress plate delay is substantially 90 degrees. The vertical polarizer 703 receives the light 704 and rejects any content that is horizontally polarized and passes the vertical content as light 702. The detector 709 measures the signal strength of the light 702 that passes through the polarizer 703. The closer the delay of the stress plate 408 is to 90 degrees, the more the light 704 is rejected and the smaller the signal strength that is measured for the light 702. As the stress plate delay varies from 90 degrees, the detector 709 will detect a higher signal strength of light passing through the polarizer 703.

In a step 312, it is determined whether the delay of the stress plate is sufficiently close to the desired amount. If the measurement system 700 is used, then the decision 312 is made based the measured signal strength of the light 702. In other words, if the signal strength is above a threshold, then the delay is not sufficiently close to the desired 90 degrees. If the delay is sufficient, then the process ends and the stress plate 408 is complete and is ready for use. If the delay is not sufficient then the compression and/or tensile force can be incremented in step 314, and the measurement process can be repeated until the desired delay is reached.

B. Shear Forces

Figure 8:
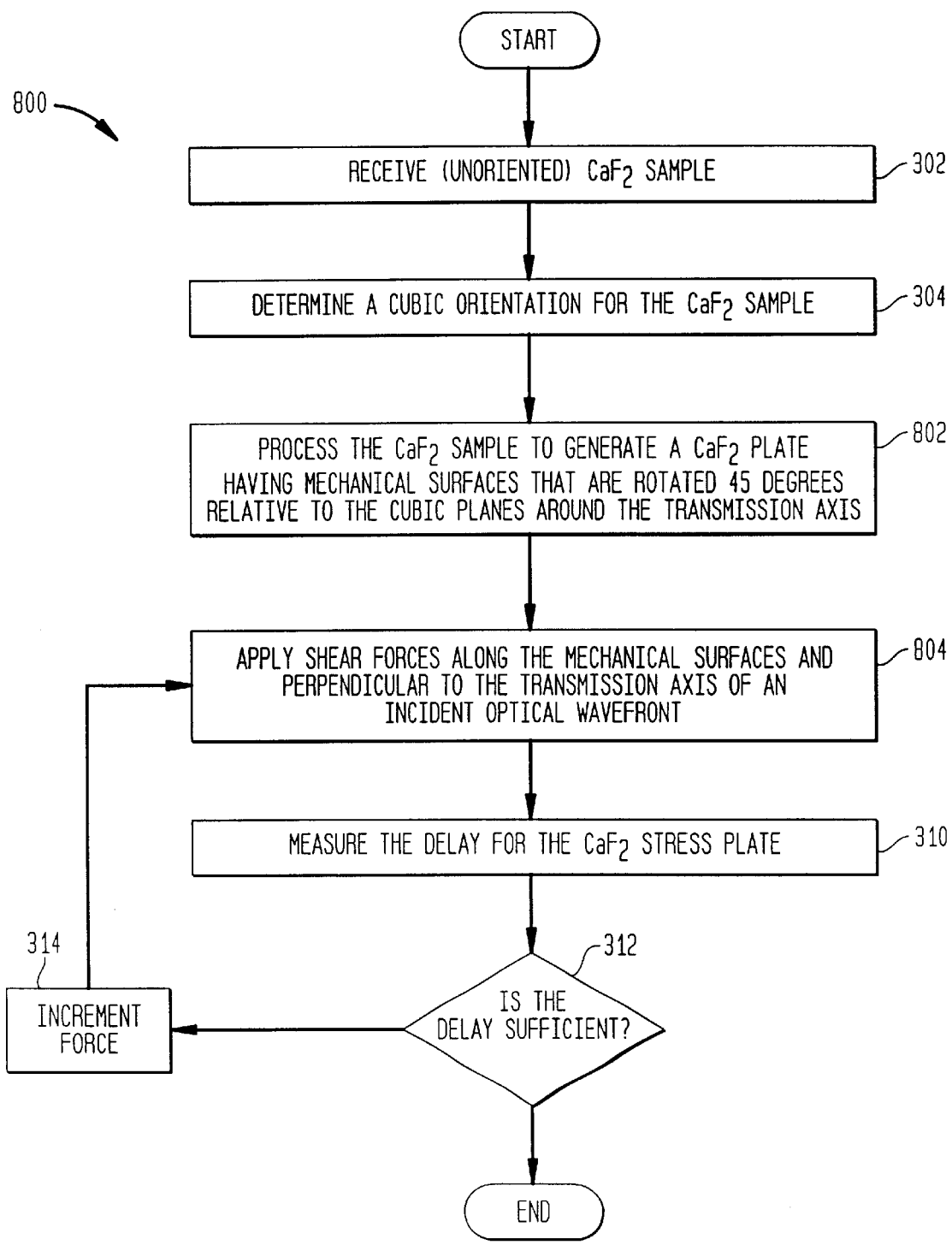
FIG. 8 illustrates a flowchart 800 for making a $CaF_2$ stress plate using shear forces according to embodiments of the present invention.

Flowchart 300 described a method of making a $CaF_2$ stress plate using compression and/or tensile forces that are applied perpendicular to the mechanical surfaces/cubic planes of the $CaF_2$ plate. Alternatively, a $CaF_2$ stress plate can be fabricated using shear forces that are applied to the plate. FIG. 8 depicts a flowchart 800 that describes a method of making a $CaF_2$ stress plate using one or more shear forces. Steps 302, 304 and 310–314 in flowchart 800 are the same as those described in flowchart 300, to which the reader is directed for further details. The new steps 802 and 804 are described as follows.

Figure 9:
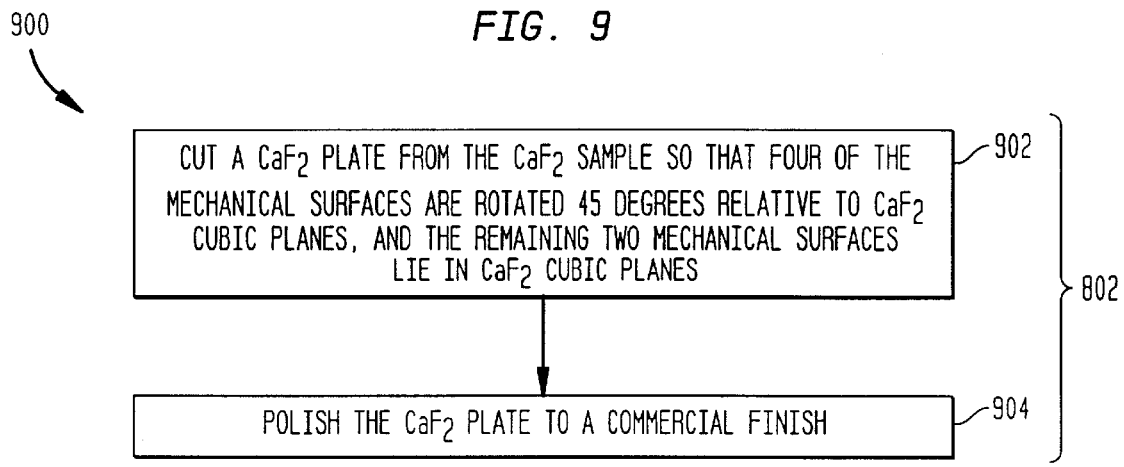
FIG. 9 illustrates a flowchart 900 for processing a sample of $CaF_2$ to produce a $CaF_2$ plate having mechanical surfaces that are rotated 45 degrees around the transmission axis relative to the $CaF_2$ cubic planes according to embodiments of the invention.

In a step 802, the $CaF_2$ sample is processed to generate a $CaF_2$ plate having mechanical surfaces that are rotated 45 degrees relative to the $CaF_2$ cubic planes around the transmission axis, Step 802 is further described by flowchart 900 that is shown in FIG. 9 and is described as follows. In a step 902, a $CaF_2$ plate is cut from the $CaF_2$ sample so that four of the mechanical surfaces (that do not define the transmission axis) are rotated 45 degrees relative to the $CaF_2$ cubic planes that were found in step 304. Various techniques for cutting or grinding crystal materials are known by those skilled in the arts. The other two mechanical surfaces are cut to lie in $CaF_2$ cubic planes, and define the transmission axis for the optical wavefront. In a step 904, the $CaF_2$ plate is polished to a commercial finish, so that the surfaces are sufficiently flat and parallel as needed for optical transmission.

Figure 10A:
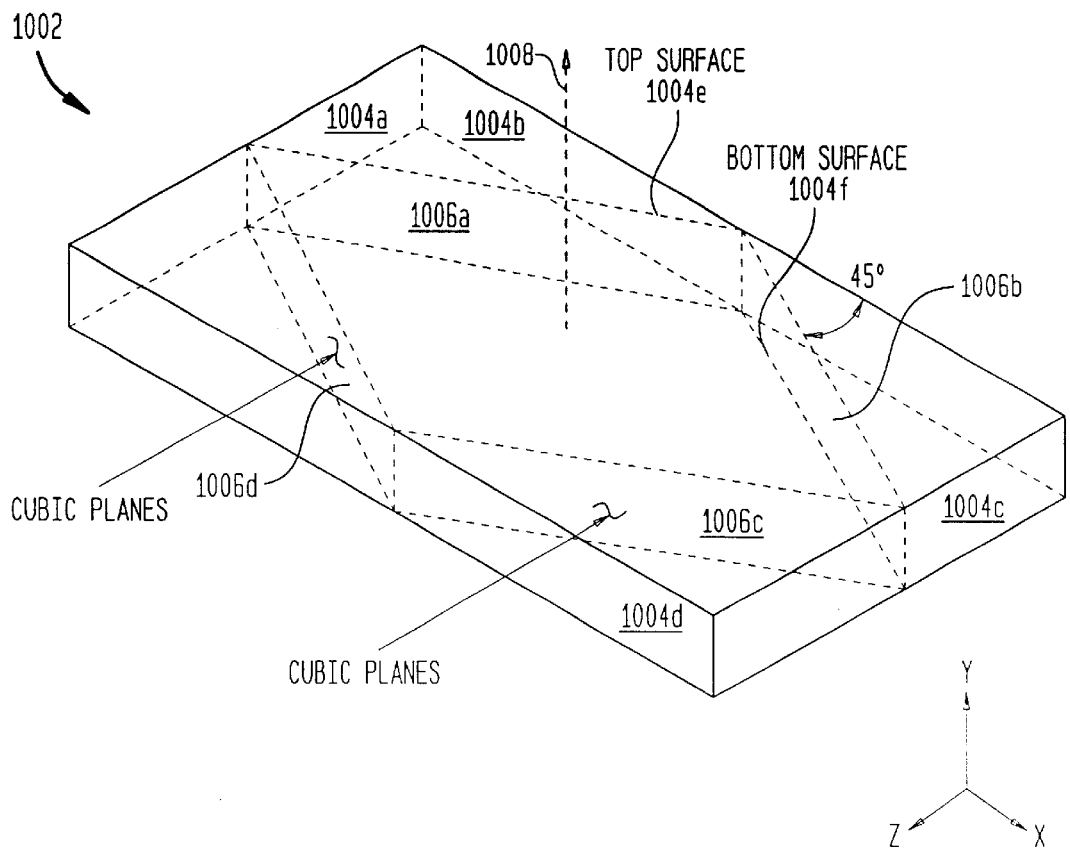
FIG. 10A illustrates a $CaF_2$ plate having mechanical surfaces that are rotated 45 degrees relative to $CaF_2$ cubic planes.

FIG. 10A depicts a $CaF_2$ plate 1002 after being processed according to steps 902 and 904. As described, the $CaF_2$ plate 1002 has mechanical surfaces 1004a–d that are rotated by 45 degrees around the transmission axis 1008 relative to the cubic planes 1006a–d. As such, the cubic planes 1006a–d form a "diamond" shape within the plate 1002 as shown in FIG. 10A. The mechanical surfaces 1004e and 1004f are the "top" and "bottom" surfaces of the plate 1002, respectively, and lie in CaF cubic planes. As such, the mechanical surfaces 1004e and 1004f are perpendicular to (and define) the optical transmission axis 1008.

In a step 804, shear forces are applied along the mechanical surfaces, and perpendicular to the transmission axis of the incident optical wavefront. The shear forces are directed at opposite corners of the $CaF_2$ plate in a manner that prevents the $CaF_2$ plate from rotating. As with the compression/tensile force method, the shear forces change the index of refraction of the $CaF_2$ plate in the direction of resultant force vectors in order to implement the desired optical delay.

Figure 10B:
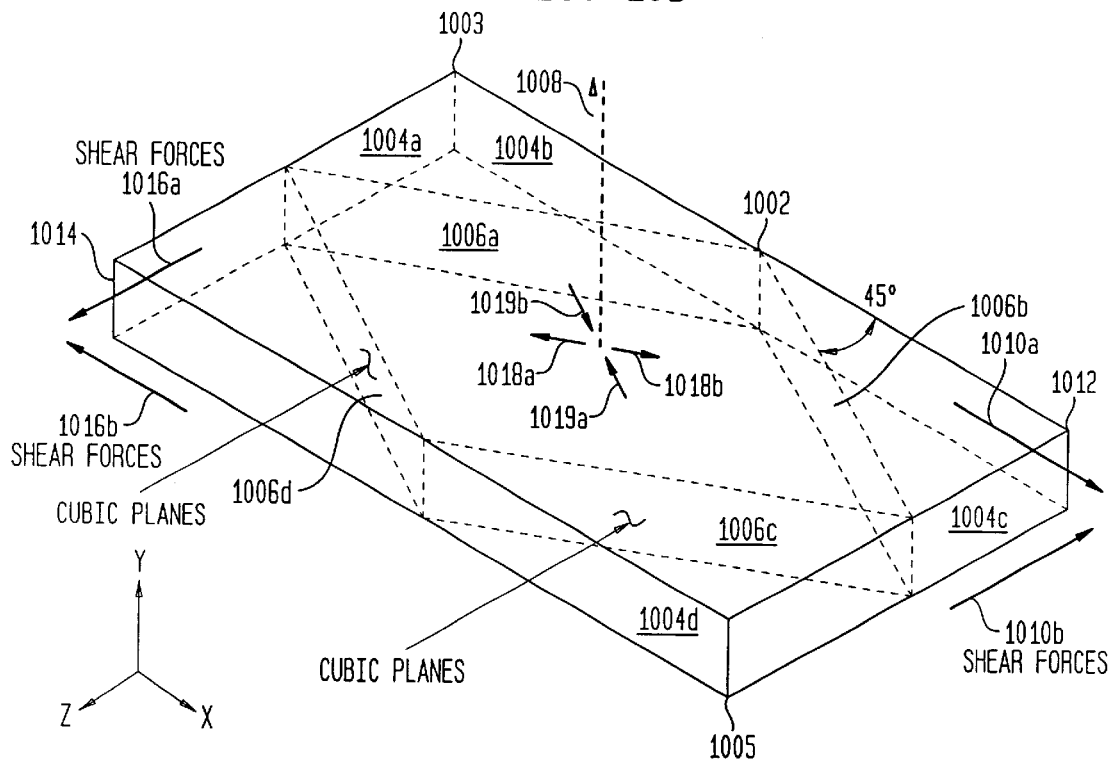
FIGS. 10B–10C illustrate various embodiments for applying shear forces along (or adjacent to) $CaF_2$ cubic planes to implement optical delay according to embodiments of the invention.
Figure 10C:
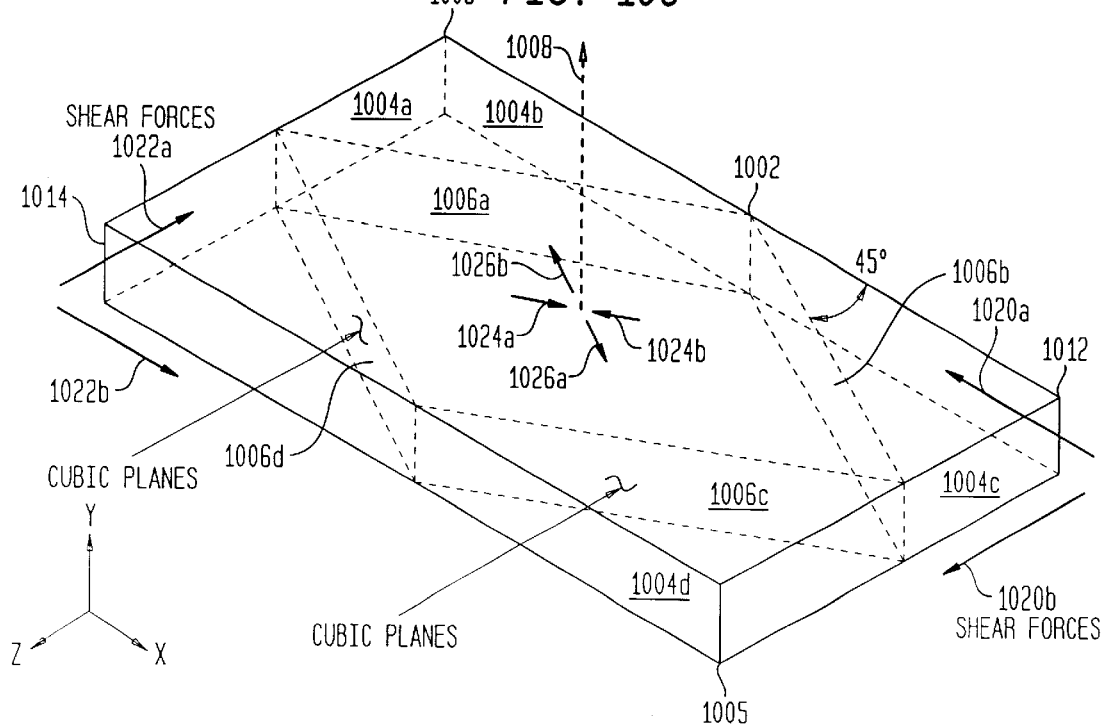

FIGS. 10B and 10C illustrates some of the various embodiments for the application of the shear forces to change the index of refraction of the $CaF_2$ plate. FIGS. 10B and 10C are discussed as follows.

In FIG. 10B, shear forces 1010a and 1010b are applied to corner 1012 along the surfaces 1004b and 1004c, respectively. Also, shear forces 1016a and 1016b are applied to corner 1014 along surfaces 1004a and 1004d, respectively. Shear forces can be implemented by epoxying a bar to each surface 1004 and pushing or pulling on the bar in the appropriate direction. The resultant forces include a stretching force 1018a and 1018b that acts to stretch corners 1012 and 1014 away from each other. Also, a compression force 1019a and 1019b acts to compress corners 1003 and 1005 toward each other. Stretching force 1018a,b and compression force 1019a,b change the index of refraction along the direction of their respective axises, and therefore implement the desired optical delay. It is noted that the force 1018a,b is directed along the diagonal formed by corners 1012 and 1014. Therefore, the force 1018a,b is perpendicular to the cubic planes 1006b and 1006d, but is rotated 45 degrees in the zx plane relative to the mechanical surfaces 1004a–d. Likewise, force 1019a,b is perpendicular to cubic planes 1006a and 1006d, but is rotated 45 degrees in the zx plane relative to the mechanical surfaces 1004a–d. This is contrasted with the compression and tensile forces in FIGS. 6A–6G, which were all normal to the mechanical surfaces of the stress plate 408. A result of this distinction is that a 90 degree stress plate that is fabricated using shear forces does not have to be rotated 45 degrees in the zx plane to shift the polarization of the incident optical wavefront from linear polarization to circular polarization, and vica versa. This is so because the resultant force vectors 1018 and 1019 are already rotated 45 degrees in the zx plane.

In FIG. 10C, shear forces 1020a and 1020b are applied to the corner 1012 along the surfaces 1004b and 1004c, respectively. Also, shear forces 1022a and 1022b are applied to the corner 1014 along the surfaces 1004a and 1004d, respectively. The result is a compression force 1024a and 1024b that acts along the diagonal formed by corners 1012, 1014 and changes the index of refraction along the diagonal. Also, a stretching force 1026a and 1026b acts along the diagonal of corners 1003, 1005 and changes the index of refraction along the diagonal. As in FIG. 10B, the resultant compression force 1024a,b is normal to the cubic planes 1006b and 1006d, but is rotated 45 degrees relative to the mechanical surfaces 1004a–d. Likewise, the stretching force 1026a,b is normal to cubic planes 1006a and 1006c, but is rotated 45 degrees relative to the mechanical surfaces 1004a–d. Therefore, there is no need to rotate the stress plate in order to change the polarization of the incident optical wavefront from linear polarization to circular polarization, and vica versa.

CONCLUSION

Example embodiments of the methods and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method for making a $CaF_2$ stress plate having a specified delay for an optical wavefront that is incident to the stress plate along a transmission axis, the method comprising the steps of:
    (1) receiving a $CaF_2$ plate having surfaces aligned in corresponding $CaF_2$ cubic planes; and
    (2) applying a compressive or tensile force perpendicular to a first pair of said surfaces and perpendicular to the transmission axis, whereby said force causes the specified delay for an optical wavefront that is traveling along the transmission axis.

2. The method of claim 1, further comprising the steps of:
    (3) determining a cubic orientation of an unoriented $CaF_2$ sample prior to step (1); and
    (4) processing said $CaF_2$ sample based on said cubic orientation to generate said $CaF_2$ plate having surfaces aligned in $CaF_2$ cubic planes.

3. The method of claim 2, wherein step (4) comprises the steps of:
    (a) cutting said $CaF_2$ plate from said sample according to said cubic orientation of said sample; and
    (b) polishing said surfaces of said $CaF_2$ plate to achieve a commercial polish.

4. The method of claim 1, wherein step (2) further comprises the step of applying said force so as to cause a delay of a ¼ wavelength of the incident optical wavefront.

5. The method of claim 4, wherein step (2) further comprises the step of applying said force in an amount of approximately between 300 psi and 500 psi.

6. The method of claim 1, further comprising the steps of:
    (3) applying a second compressive force or tensile force perpendicular to a second pair of said surfaces and perpendicular to said transmission axis, said second force being a compressive force if said force in step (2) is a tensile force, said second force being a tensile force if said force in step (2) is compressive.

7. The method of claim 1, further comprising the steps of:
    (3) measuring an optical delay for said $CaF_2$ plate to determine if said measured optical delay is sufficiently close to said specified delay; and
    (4) incrementing said applied force in step (2) until said measured delay is sufficiently close to said specified delay.

8. A method for making a $CaF_2$ stress plate capable of a specified delay when an optical wavefront is incident to the stress plate along a transmission axis, the method comprising the steps of:
    (1) receiving a $CaF_2$ sample;
    (2) determining a cubic orientation of said $CaF_2$ sample; and
    (3) processing said $CaF_2$ sample to form a $CaF_2$ plate having surfaces aligned in $CaF_2$ cubic planes, comprising the steps of
        (a) cutting said $CaF_2$ plate from said sample according to said cubic orientation of said sample;
        (b) polishing said surfaces of said $CaF_2$ plate to achieve a commercial polish;
    wherein said $CaF_2$ plate is capable of being stressed to provide the specified delay for the optical wavefront.

9. The method of claim 8, further comprising the steps of:
    (4) applying a compressive or tensile force perpendicular to a pair of said surfaces and perpendicular to the transmission axis, wherein said force is of sufficient amount to cause said specified delay along the transmission axis;
    (5) measuring an optical delay for said $CaF_2$ plate to determine if the said measured optical delay is sufficiently close to said specified delay; and (6) incrementing said applied force in step (4) until said measured delay is sufficiently close to said specified delay.

10. The method of claim 9, wherein said step (4) further comprises the step of applying said force in sufficient amount to cause a delay of a ¼ wavelength of the incident optical wavefront.

11. The method of claim 9, further comprising the steps of:

(7) applying a second compressive force or tensile force perpendicular to a second pair of said surfaces and perpendicular to the transmission axis, said second force being a compressive force if said force in step (4) is a tensile force, said second force being a tensile force if said force in step (2) is compressive.

12. A method for making a $CaF_2$ stress plate having a specified delay for an optical wavefront that is incident to the stress plate along a transmission axis, the method comprising the steps of:

(1) receiving a $CaF_2$ plate having a first set of mechanical surfaces that are rotated approximately 45 degrees to a first set of $CaF_2$ cubic planes; and a second set of mechanical surfaces that lie in a second set of $CaF_2$ cubic planes and define the transmission axis; and (2) applying shear forces to said first set of mechanical surfaces of the $CaF_2$ plate, whereby said shear forces cause the specified delay for an optical wavefront that is traveling along the transmission axis.

13. The method of claim 12, further comprising the steps of:

(3) determining a cubic orientation of an unoriented $CaF_2$ sample prior to step (1); and (4) processing said $CaF_2$ sample based on said cubic orientation to generate said $CaF_2$ plate having said first set of mechanical surfaces that are rotated 45 degrees to said first set of $CaF_2$ cubic planes, and said second set of mechanical surfaces that lie in said second set of $CaF_2$ cubic planes.

14. The method of claim 13, wherein step (4) comprises the steps of:

(a) cutting said $CaF_2$ plate from said sample according to said cubic orientation of said sample; and (b) polishing said surfaces of said $CaF_2$ plate to achieve a commercial polish.

15. An optical delay apparatus comprising a $CaF_2$ plate having a first index of refraction vector that is perpendicular to a first set of cubic planes associated with said $CaF_2$ plate, a second index of refraction vector that is perpendicular to a second set of cubic planes that is associated with said $CaF_2$ plate, wherein said first and second index of refraction vectors are perpendicular to a transmission axis associated with said $CaF_2$ plate, whereby an optical wavefront traveling through said $CaF_2$ plate along said transmission axis is delayed by an amount proportional to the difference between said first index of refraction vector and said second index of refraction vector.

* * * * *